United States Patent
Crumly et al.

[19]

[11] Patent Number: 6,166,333
[45] Date of Patent: Dec. 26, 2000

[54] BUMPS WITH PLURAL UNDER-BUMP DIELECTRIC LAYERS

[75] Inventors: William R. Crumly, Anaheim; Haim Feigenbaum, Irvine, both of Calif.

[73] Assignee: Packard Hughes Interconnect Company, Irvine, Calif.

[21] Appl. No.: 09/006,805

[22] Filed: Jan. 14, 1998

[51] Int. Cl.[7] .................................................. H05K 1/03
[52] U.S. Cl. .................... 174/255; 438/613; 361/768; 174/267; 174/260; 29/840; 29/846
[58] Field of Search ........................... 29/840, 846, 832; 174/261, 260, 267; 361/767, 768, 774; 438/613, 616

[56] References Cited

U.S. PATENT DOCUMENTS

| | | | |
|---|---|---|---|
| 4,851,615 | 7/1989 | Butt | 174/68.5 |
| 5,207,887 | 5/1993 | Crumly et al. | 205/78 |
| 5,245,135 | 9/1993 | Schreiber et al. | 174/261 |
| 5,245,750 | 9/1993 | Crumly et al. | 29/840 |
| 5,451,722 | 9/1995 | Gregoire | 174/261 |
| 5,790,377 | 8/1998 | Schreiber et al. | 361/704 |
| 5,937,512 | 8/1999 | Lake et al. | 29/832 |
| 6,085,414 | 7/2000 | Swarbrick et al. | 29/847 |

*Primary Examiner*—Jeffrey Gaffin
*Assistant Examiner*—Kamand Cuneo
*Attorney, Agent, or Firm*—Richard A. Jones

[57] ABSTRACT

The present invention includes composite support substrate for both flexible and rigid board circuit applications and method of making the same. The composite substrate is composed of at least two materials formed under the circuitry. A first material is a conventional matrix such as a polyimide/acrylic adhesive, and a second material having unique properties that are useful locally in isolated locations. For instance, the second material may be nonporous to moisture, optically clear, and/or thermally conductive. The second material is integrated into the circuit matrix at specific localized areas where desired with portions coplanar with the first material so that circuit traces remain continuous as they pass from the first material to the second. For example, an integrated circuit chip may be isolated from the polyimide matrix, which is porous in moisture, by using the second material that is nonporous to moisture at locations where the integrated circuit chip is to be attached, thus isolating the integrated circuit chip from the polyimide and preventing moisture from flowing through to the chip.

21 Claims, 3 Drawing Sheets

BUMPS WITH PLURAL UNDER-BUMP DIELECTRIC LAYERS

TECHNICAL FIELD

This invention relates to a composite circuitry for connection to electronic devices.

BACKGROUND OF THE INVENTION

Crumly and Feigenbaum, U.S. Pat. No. 5,245,750, disclose an integrated circuit chip, "Flip Chip", that is connected to a circuit by providing a raised feature on the circuit which is coated with material capable of forming an electrical connection and attachment to a pad of the integrated circuit chip. The material may be soldered or may be a Z-axis adhesive which becomes conductive at areas where it is compressed. The raised feature on the circuitry may be produced by providing a mandrel having a recess area complementary to the raised feature, and suitably plating the circuitry on the mandrel including the recessed area. Upon subsequent lamination of a dielectric layer and removal from the mandrel, there is produced a circuitry on a dielectric with a raised feature which can be used to attach an integrated circuit chip. Heretofore, the dielectric layer material of choice has been a polyimide such as Kapton®. However, it has been found that the polyimide layer tends to adsorb moisture and therefore could effect the long term reliability of the semiconductor device attached thereto, especially in non-controlled environments. For the above and other applications it would be desirable to have a composite flexible circuitry having a support substrate with locally tailored materials having various properties and a method of making the same.

SUMMARY OF THE INVENTION

The present invention includes a unique composite circuitry for both flexible and rigid board circuit applications and method of making the same. The composite circuitry is composed of at least two materials. A first material is a conventional matrix such as a polyimide/acrylic adhesive, and a second material having unique properties that are useful locally in isolated locations. For instance, the second material may be nonporous to moisture, optically clear, and/or thermally conductive. The second material is integrated into the circuit matrix at specific localized areas where desired so that circuit traces remain continuous as they pass from the first material to the second. For example, an integrated circuit chip may be isolated from the polyimide matrix, which is porous in moisture, by using the second material that is nonporous to moisture at locations where the integrated circuit chip is to be attached, thus isolating the integrated circuit chip from the polyimide and preventing moisture from flowing through to the chip.

These and other objects, features and advantages will become apparent from the following brief description of the drawings, detailed description and appended claims and drawings.

DESCRIPTION OF THE PREFERRED EMBODIMENT

Figure 1:
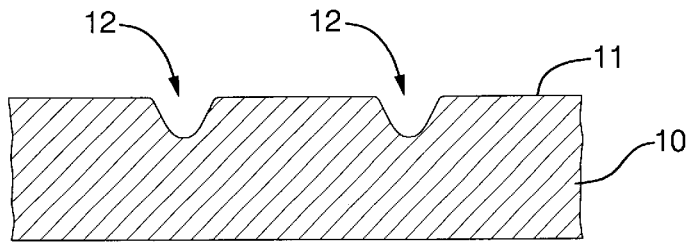
FIGS. 1–13 are sectional views made from locally isolated materials, a sequence of steps in the preparation of circuitries on a substrate and subsequent attachment of an integrated circuit chip according to the present invention.
Figure 2:
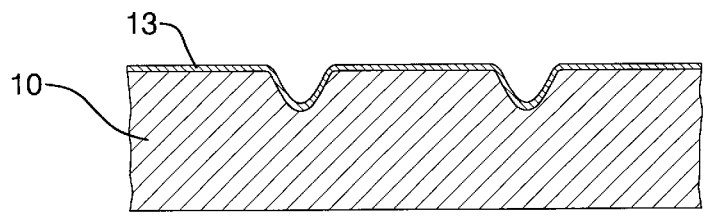
Figure 3:
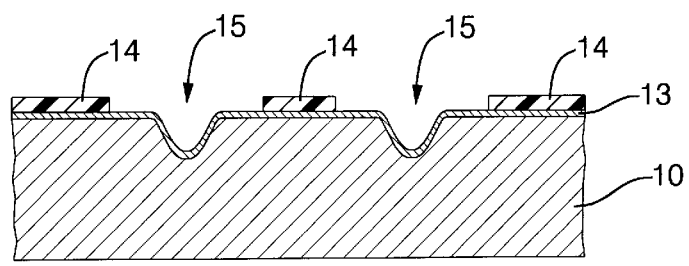

FIGS. 1–13 illustrate a series of steps for providing a circuitry substrate made from at least two different locally isolated materials, and subsequent attachment of a semiconductor device such as an integrated circuit chip according to the present invention. This may be accomplished through the use of a mandrel 10 of stainless steel, having an upper surface 11, as seen in FIG. 1. Dimples 12 are formed in the mandrel to produce raised features for connecting to an integrated circuit. However, raised features may not be necessary for other applications. Next, there is provided over the surface 11 a continuous copper coating 13, as shown in FIG. 2. This is a thin electroplated flash coating of a thickness of about 0.2 mil. As shown in FIG. 3, a photoresist 14 is applied over the flash coating 13, leaving spaces 15 which correspond to an electrical circuit to be produced including the area of the dimple.

Figure 4:
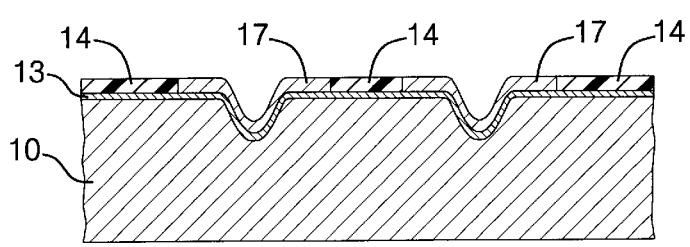
Figure 5:
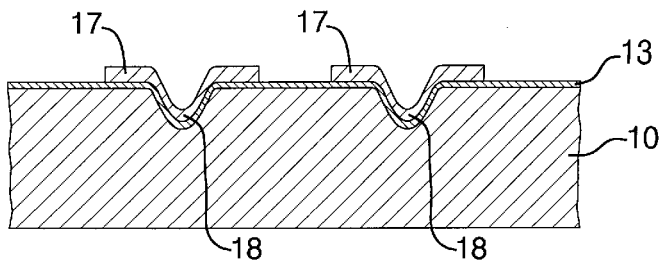

Then, a thicker layer copper is electroplated in the spaces 15 over the flash coating 13 (FIG. 4). The result is a circuit trace 17 as well as what will become a raised feature or bump 18 at the location of the dimple 12 (shown in FIG. 1). The photoresist 14 then is stripped away, leaving only the electroplated circuit traces 17 and the raised feature or 18, as well as the flash copper plating 13, on the mandrel 10 (FIG. 5).

Figure 6:
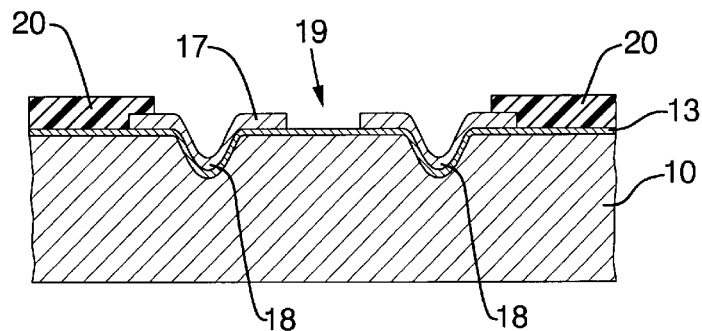

After this, a first substrate circuit support material such as a dielectric layer 20, preferably Kapton®, is selectively laminated to portions of the circuit traces 17, and the exposed flash copper plating on the mandrel, as shown in FIG. 6. The dielectric layer (first portion) 20 may be provided with pre-drilled holes 19 or blanked windows, or may be subsequently etched to provide holes where no polyimide is desired, such as at the location of the raised feature 18.

Figure 7:
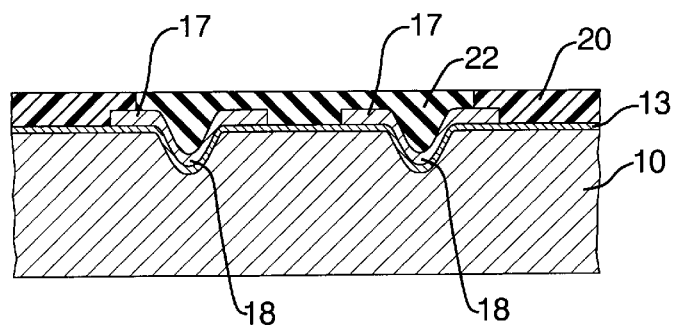
Figure 8:
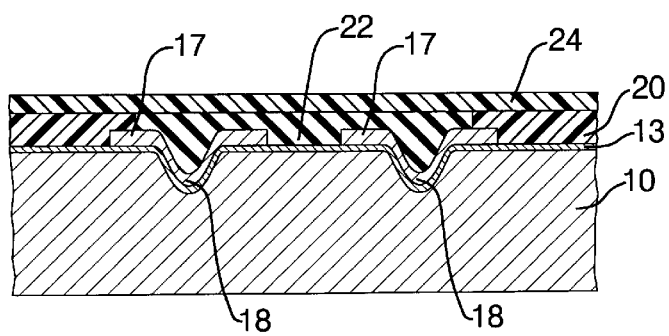

A second support substrate material or second layer (second portion) 22 may be applied as an encapsulation of the area where no polyimide is desired (such as the raised feature location) and to fill in the hole 19 as shown in FIG. 7. The second layer 22 is surrounded by the first layer 20 and so that layers 20, 22 are in the same plane. Preferably the second layer 22 (second portion) has properties that are substantially different than the first layer 20 (first portion). Suitable material for the second layer 22 may include polyfluorocarbon (not porous to moisture), such as Teflon®, or epoxy, ceramic or glass. Likewise materials that are more optically clear; thermally conductive; or have a greater or lesser stiffness than the first substrate; or have a different coefficient of thermal expansion, may be deposited in the hole as the second layer 22. Optionally, a third dielectric layer 24 may be deposited over the first and second layers 20, 22 as shown in FIG. 8. The first and third dielectric layers may be the same material.

Figure 9:
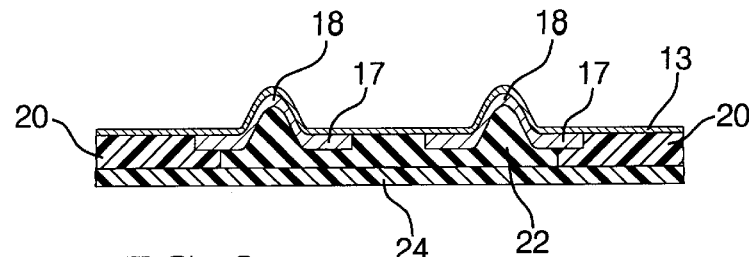
Figure 10:
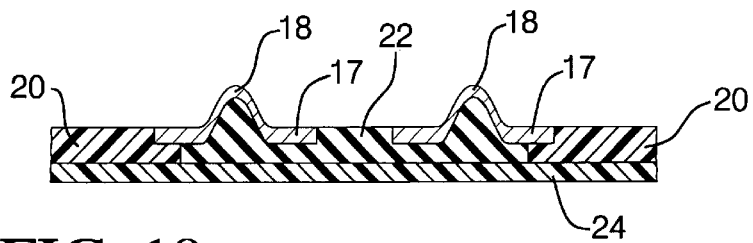
Figure 11:
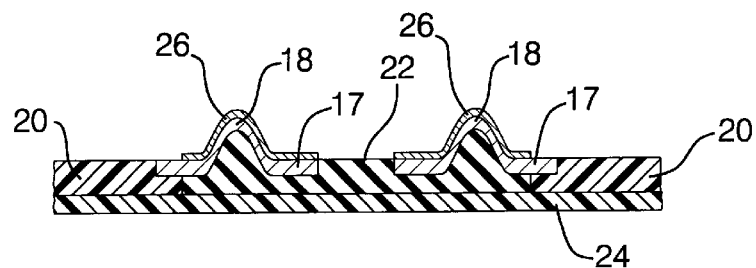
Figure 12:
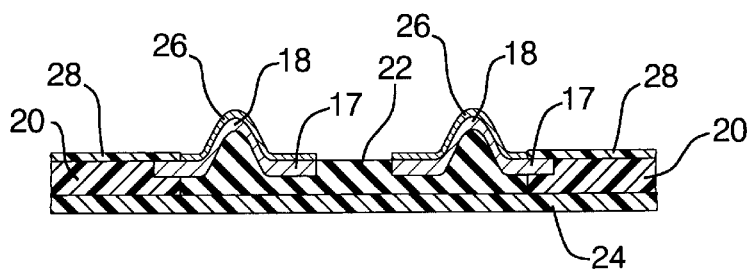

The composite is then stripped from the mandrel 10 as shown in FIG. 9. The flash copper 13 is removed, the top 20, 22 and bottom 24 covers are laminated as shown in FIG. 10. A barrier layer or solder 26 may be applied to the raised feature 18 to provide a product shown in FIG. 11. A fourth dielectric layer 28 may be selectively applied over exposed portions of the electric trace 17 is shown in FIG. 12. Alternatively, multiple layers fabricated in this manner can be laminated together to form multi-layer circuits that have locally tailored properties on some or all of the layers.

Figure 13:
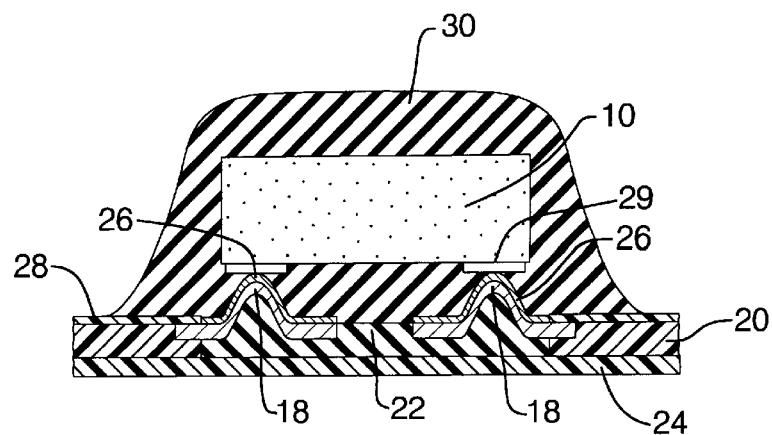

Referring to FIG. 13, thereafter a semiconductor device 10 such as an integrated circuit flip chip is soldered to the raised feature 18 to provide electrical or thermal paths to contact pads 29 on the integrated circuit chip 10. A top side encapsulation material or passivation material (such as a silicone gel) 30 is applied to the integrated circuit flip chip to provide a finished product.

Of course the invention has other applications besides isolating integrated circuits from moisture. For example, in accordance to the present invention, membrane probes have been made where the traces are embedded in an adhesive bonded to a polyimide, such as Kapton®, for support for most of their length, but are embedded in silicone rubber over where the raised feature or bump or dots contact the chip. In this manner the dot-to-dot compliances are approved by an order of magnitude, and the clarity is improved by removing the yellow tinted polyimide and replacing it with optically clear silicone rubber. Fabrication by the method described above allows traces to extend continuously from the polyimide/adhesive flex into the silicone rubber.

What is claimed is:

1. A product comprising:
   a circuit support substrate having a first portion having a first property and at least a second portion having a second property different from the first property, said second portion being surrounded by the first portion;
   at least one circuitry on said substrate, said circuitry including an electrical trace, said second portion isolating a part of said electrical trace from said first portion so that said substrate has isolated sections of materials having said first and second properties positioned along the electrical trace; and
   the first portion and the second portion having coplanar portions contacting each other.

2. A product as set forth in claim 1 wherein the first portion comprises a polyimide and the second portion comprises a material not porous to moisture.

3. A product as set forth in claim 1 wherein the first portion has a different optical clarity, thermal conductivity stiffness, coefficient of thermal expansion or moisture permeability than the second portion.

4. A product comprising:
   a substrate comprising a first dielectric layer of material porous to moisture and having a hole that is filled with a second dielectric layer of material that is non-porous to moisture so that the second layer is surrounded by the first dielectric layer and in contact with a side wall of the hole, and
   at least one circuitry on said substrate, said circuitry including a raised electrical contact feature projecting outward from said circuitry and from the plane of said substrate, said second dielectric layer isolating said raised electrical contact feature from said first dielectric layer.

5. A product as set forth in claim 4 further comprising a semiconductor device connected to said raised electrical contact feature.

6. A device as set forth in claim 4 further comprising a third dielectric layer on said first and second dielectric layers.

7. A product as set forth in claim 4 wherein said first dielectric layer comprises a flexible polyimide.

8. A product as set forth in claim 4 wherein said second dielectric comprises an epoxy.

9. A product as set forth in claim 4 wherein said second dielectric layer comprises a polyfluorocarbon.

10. A product as set forth in claim 4 wherein said second dielectric layer comprises a ceramic.

11. A product as set forth in claim 4 wherein said second dielectric layer comprises a glass.

12. A device comprising:
    a substrate comprising a first dielectric layer that is porous to moisture and that has at least one hole, a second dielectric layer that is disposed in said at least one hole,
    the first dielectric layer and the second dielectric layer having coplanar portions contacting each other, the second dielectric layer being non-porous to moisture and a third dielectric layer;
    at least one circuitry contacting the first and second layers of said substrate, said circuitry including a raised electrical contact feature projecting outwardly from said circuitry, said second dielectric layer being located in the area of said raised electrical contact feature and isolating said raised electrical contact feature from said first dielectric layer, and said third dielectric layer overlying and contacting at least portions of said first and second dielectric layers on surfaces opposite said at least one circuitry.

13. A device as set forth in claim 12 wherein said first dielectric layer and said third dielectric layer are of the same material.

14. A device as set forth in claim 12 further including a fourth dielectric layer selectively applied over the first dielectric layer and portions of said at least one circuitry.

15. A device as set forth in claim 14 further comprising a semi-conductor device connected to said raised electrical contact feature, said semiconductor device and said raised electrical contact feature being encapsulated in a material.

16. A method comprising:
    providing a mandrel;
    depositing electrical traces on the mandrel forming a circuitry;
    laminating a first layer of material having a first property to said circuitry, wherein said first layer includes a hole formed therein;
    depositing a second layer having a second property on the mandrel and filling said hole formed in said first layer to provide a circuit on a substrate having localized properties wherein said first layer and said second layer include coplanar portions contacting each other and said second layer is surrounded by the first layer and isolates a part of said electrical trace so that said substrate has isolated sections of material having first and second properties positioned along the electrical trace.

17. A method as set forth in claim 16 further comprising attaching an integrated circuit chip to the circuit.

18. A method as set forth in claim 16 further comprising depositing a third layer over said first layer and over said second layer.

19. A method as set forth in claim 18 wherein said third layer and first layer are the same material.

20. A method as set forth in claim 17 further comprising the step of providing a passivation layer over said integrated circuit chip.

21. A method as set forth in claim 16 wherein the mandrel has a dimple formed therein and an electrical trace is deposited into the dimple to provide a circuit with a raised feature.

* * * * *